United States Patent
Hess et al.

(10) Patent No.: US 6,993,986 B2
(45) Date of Patent: Feb. 7, 2006

(54) CLAMPING ELEMENT WITH AN INTEGRATED FORCE SENSOR

(75) Inventors: Peter Hess, Menzingen (CH); Raphael Bernhardsgruetter, St. Gallen (CH); Alexander Greber, Eich (CH); Hansjörg Gujer, Steinhausen (CH); Nicolino Onda, Bad Ragaz (CH)

(73) Assignee: ESEC Trading SA, Cham (CH)

( * ) Notice: Subject to any disclaimer, the term of this patent is extended or adjusted under 35 U.S.C. 154(b) by 192 days.

(21) Appl. No.: 10/606,146

(22) Filed: Jun. 24, 2003

(65) Prior Publication Data

US 2004/0025605 A1    Feb. 12, 2004

(30) Foreign Application Priority Data

Jun. 28, 2002  (CH) ........................... 1139/02

(51) Int. Cl.
*F16B 2/02*  (2006.01)
*G01M 19/00* (2006.01)
*G01B 7/30*  (2006.01)

(52) U.S. Cl. .................. 73/865.9; 73/862.541; 24/489

(58) Field of Classification Search .......... 73/865.9, 73/862.541; 24/489
See application file for complete search history.

(56) References Cited

U.S. PATENT DOCUMENTS

| | | | | |
|---|---|---|---|---|
| 5,163,222 A | * | 11/1992 | Imlig et al. | 29/827 |
| 5,285,946 A | | 2/1994 | Tomigashi et al. | 228/9 |
| 5,388,751 A | | 2/1995 | Harada et al. | 228/4.5 |
| 5,704,246 A | | 1/1998 | Krüger | 73/159 |

FOREIGN PATENT DOCUMENTS

| | | | |
|---|---|---|---|
| CH | 679 878 | | 4/1992 |
| CH | 689 188 | | 11/1998 |
| DE | 271935 A | * | 9/1989 |
| DE | 195 23 229 | | 1/1997 |
| EP | 0452 041 | | 10/1991 |
| SE | 9901111 A | * | 9/2000 |

OTHER PUBLICATIONS

European Search Report, EP 02 07 7647 dated Jan. 7, 2003, 1 page.

* cited by examiner

*Primary Examiner*—Thomas P. Noland
(74) *Attorney, Agent, or Firm*—Thelen Reid & Priest LLP; David B. Ritchie

(57) ABSTRACT

A clamping element for the transport of a substrate in a predefined transport direction comprises a first and a second leg with a first and second clamping jaw for clamping a substrate. Each of the two clamping jaws has a clamping plate which is movable in transport direction relative to the corresponding leg. A sensor measures the deflection of the first clamping plate relative to the first leg. As soon as the measured deflection exceeds a predefined threshold value, the clamping element is opened.

12 Claims, 2 Drawing Sheets

CLAMPING ELEMENT WITH AN INTEGRATED FORCE SENSOR

PRIORITY CLAIM

The present application claims priority under 35 U.S.C § 119 based upon Swiss Patent Application No. 2002 1139/02 filed on Jun. 28, 2002.

FIELD OF THE INVENTION

The invention concerns a clamping element with an integrated force sensor.

BACKGROUND OF THE INVENTION

With the mounting or wiring of semiconductor chips by means of automatic assembly machines, known in the trade as Die Bonders or Wire Bonders, such a clamping element is suitable for the transport of substrates in a predetermined direction. A transport apparatus working with clamping elements of this kind is known from U.S. Pat. No. 5,163,222, while such a clamping element is known from CH 679,878.

Many different materials are used as substrates. On the one hand, metal strips punched out of a sheet, so-called leadframes, serve as substrates. As a rule, such leadframes are still comparatively thick and quite stable. On the other hand, foil strips made of plastic are used as substrates which are as thin as a piece of paper. The substrates are taken from a stack or a magazine and fed to a transport apparatus containing at least one clamping element by means of which they are moved in cycles in the transport direction and fed to at least one processing station. Generally, a Die Bonder comprises two processing stations, namely a dispensing station, where a portion of adhesive is applied to a substrate location, and a bonding station, where a semiconductor chip is placed onto the substrate. On the other hand, a Wire Bonder comprises only one single processing station where the semiconductor chips are wired to the substrate. After processing, the substrates are transported further and inserted into a magazine. Such a magazine is a container with numerous grooves arranged one above the other and the substrates are inserted into the spaces between them. Unfortunately, it often happens that a substrate catches or jams on some part of the magazine before it has reached its final position in the magazine. In doing so, the substrate can be damaged or even destroyed especially when it is relatively thin.

In order to prevent damage to or destruction of the substrate in such a case, with some automatic assembly machines a roller is used which rests on the edge of the substrate. When the substrate is transported in transport direction, the roller rolls on the substrate and delivers a signal that it is rotating. As soon as the substrate catches somewhere, then its position no longer changes in relation to the roller: The roller is stationary. The roller standstill initiates a signal in order to immediately stop the transport apparatus. This detection method functions sufficiently well with relatively stable substrates however not with thin foil strips made of plastic.

Another method practised consists in reducing the clamping force produced by the clamping element for holding the substrate as far as possible so that the clamping element simply slides along the substrate as soon as the substrate catches somewhere. On the one hand, setting the clamping element is a difficult task. On the other hand, a special drive is necessary for the clamping element so that the clamping jaws open and close reliably. Also, this method can no longer be used with thin foil strips.

BRIEF DESCRIPTION OF THE INVENTION

The object of the invention is to develop a sensor which enables the catching or jamming of the substrate during the transport phase to be detected and the stopping of the transport apparatus to be carried out before the substrate, is damaged.

A clamping element for the transport of a substrate in a predetermined transport direction comprises a first and a second leg with a first and second clamping jaw for clamping a substrate. Each of the two clamping jaws has a clamping plate which is movable in transport direction relative to the corresponding leg. A sensor measures the deflection of the first clamping plate in relation to the first leg. An output signal of the sensor contains the information whether the two clamping jaws are to remain closed or are to be opened: As soon as the measured deflection exceeds a predefined threshold value, the clamping element is opened.

BRIEF DESCRIPTION OF THE DRAWING FIGURES

The accompanying drawings, which are incorporated into and constitute a part of this specification, illustrate one or more embodiments of the present invention and, together with the detailed description, serve to explain the principles and implementations of the invention. The figures are not to scale.

DETAILED DESCRIPTION OF THE PREFERRED EMBODIMENT

Figure 1:
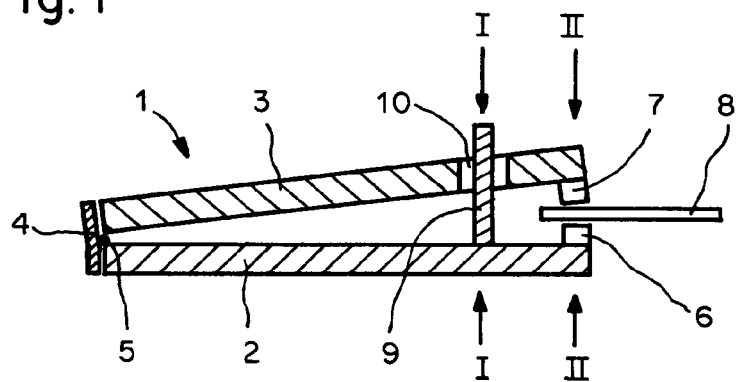
FIG. 1 shows a clamping element with an integrated force sensor.
Figure 2:
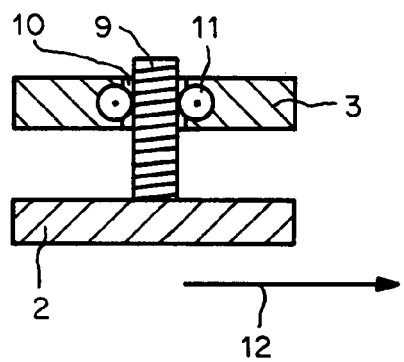
FIG. 2 shows the clamping element along a line I—I of FIG. 1.

FIG. 1 shows a side view of a clamping element 1 with an integrated force sensor. The clamping element 1 comprises two legs 2 and 3 which are connected at one end by means of a fixed joint 4, in order to enable a rotational movement of the upper leg 3 on an axis 5 running vertically to the plane. The other end of each of the two legs 2 and 3 comprises a clamping jaw 6 or 7 which clamp a substrate 8. A preferably electromagnetic drive which turns the upper leg 3 on the axis 5 serves to open and close the clamping element 1. Furthermore, the clamping element 1 optionally comprises a bolt 9 secured to the lower leg 2 and bearing on the upper leg 3. The bolt 9 protrudes into a drill hole 10 in the upper leg 3. The bolt 9 is located in the vicinity of the two clamping jaws 6 and 7. FIG. 2 shows a section of the clamping element 1 along the line I—I of FIG. 1. Two ball bearings 11 are arranged on the upper leg 3 for bearing the bolt 9.

The clamping element 1 serves to transport the substrate 8 in a given transport direction 12 (FIG. 2) which runs parallel to the axis 5. A transport apparatus suitable for this purpose is known, for example, from EP 330 831 quoted at the beginning. The bolt 9 ensures that, on acceleration and braking, the relative position of the two legs 2 and 3 does not change in relation to the transport direction 12 as a change in the relative position would induce an error signal in the force sensor.

Figure 3:
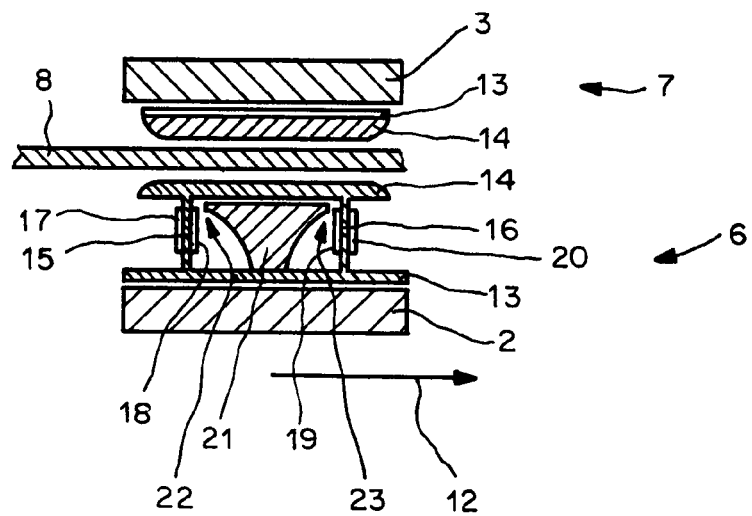
FIG. 3 shows the clamping element along a line II—II of FIG. 1.

FIG. 3 shows a section of the clamping jaws 6 and 7 of the clamping element 1 along the line II—II of FIG. 1. Both clamping jaws 6 and 7 each comprise a fixing plate 13 and a clamping plate 14 which run parallel to each other and which are connected by two bridges 15 and 16. From the upper clamping jaw 7, only the clamping plate 14 and the fixing plate 13 are visible. The fixing plate 13 is secured to the corresponding leg 2 or 3, while the two clamping plates 14 have clamping surfaces facing towards each other for clamping the substrate 8. The clamping plate 14 is carried, movable in transport direction in relation to the fixing plate 13, by the two bridges 15 and 16. The fixing plate 13, the clamping plate 14 and the two bridges 15 and 16 are manufactured from one piece of material and form a fixed joint. The two clamping jaws 6 and 7 can be formed identically. However, they can also have a different geometry as with the embodiment shown in FIG. 3 so that the bridges 15 and 16 of the lower clamping jaw 6 run in vertical direction, the bridges 15 and 16 of the upper clamping jaw 7 on the other hand run in horizontal direction.

Each force exerted on the clamped substrate 8 in or against the transport direction 12 causes a deflection of the clamping plates 14 in relation to the fixing plates 13 screwed rigidly to the legs 2 and 3 of the clamping element 1. In doing so, the bridges 15 and 16 are deformed. This deformation of the bridges 15 and 16 is detected by means of a sensor and evaluated. The sensor preferably consists of four strain gauges 17–20, which are wired as a bridge circuit. The four strain gauges 17–20 are glued onto the bridges 15 and 16 whereby, as seen in transport direction 12, one strain gauge is located on each side of the bridge. The four strain gauges 17–20 represent piezoelectric resistors. The output signal $U_{Out}$ of the bridge circuit is amplified and a signal U is formed, which indicates whether the clamping jaws 6 and 7 are to remain closed or are to be opened. The signal U is a binary signal which designates the two conditions "clamp" and "open". The fixing plate 13, the clamping plate 14 and the two bridges 15 and 16 together with the four strain gauges 17–20 form the force sensor.

On transport of the substrate 8, different forces act upon the clamping jaws 6 and 7, namely by means of the forces caused by acceleration and braking as well as frictional forces because the substrate 8 slides on a support. The sum of these forces causes a continuously changing deflection of the clamping plates 14 in relation to the fixing plates 13 rigidly screwed to the legs 2 and 3 of the clamping element 1.

In the following, two versions are explained as to how the signal U can be formed from the signal $U_{Out}$. In both versions, the signal $U_{Out}$ is subjected to known statistical methods in order to eliminate or at least dampen noise and/or interference signals.

Version 1

With this version, the signal U carries the value "open", as soon as the signal $U_{Out}$ exceeds a predetermined threshold value $U_S$. When the substrate 8 transported by the clamping element 1 catches somewhere, then the clamping plates 14 continue to be further deflected in relation to the fixing plates 13 rigidly screwed to the legs 2 and 3 of the clamping element 1. As soon as the deflection exceeds a measure corresponding to the threshold value $U_S$ the command is given to open the clamping jaws 6 and 7.

Version 2

Figure 4:
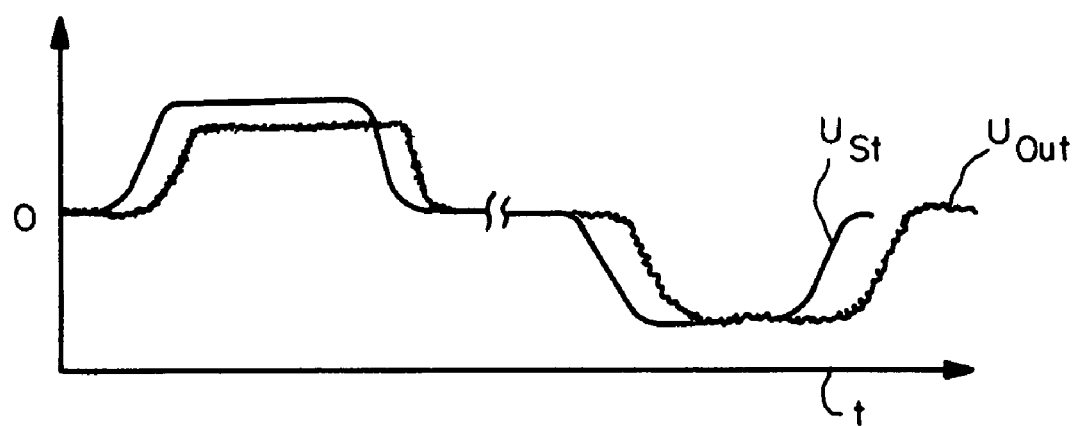
FIG. 4 shows the progression of a control signal and the output signal of the force sensor.

With this version, data concerning the current condition of the transport movement is also taken into consideration. In the following, the variable t designates time. FIG. 4 shows the control signal $U_{St}(t)$ applied to the assigned drive which corresponds to the given progression of the acceleration of the clamping element 1 in transport direction 12 and the signal $U_{Out}(t)$ delivered by the sensor. The signal $U_{Out}(t)$ follows the control signal $U_{St}(t)$ with a time offset.

Transport of the substrate 8 takes place in cycles: The clamping element 1 firmly clamps the substrate 8, transports it by a specific distance, releases the clamping of the substrate 8 and is moved back by a specific distance. If necessary, the next cycle then takes place. For transport of the substrate 8 during a cycle, the control signal $U_{St}(t)$ contains three successive phases: An acceleration phase, an acceleration-free phase and a braking phase. The signal $U_{Out}(t)$ does not disappear during the acceleration-free phase because a friction force acts upon the substrate 8 sliding on the support or, on introduction into the magazine, rubbing on a groove or side wall.

A signal $U_a(t)$ is now formed from the control signal $U_{St}(t)$ which closely corresponds to the signal produced in the force sensor as a result of the acceleration. Then an output signal $U_{Out,\,korr}(t)$ is formed corrected by this signal $U_a(t)$:

$$U_{Out,\,korr}(t)=U_{Out}(t)-U_a(t)$$

With this version, the signal U also carries the value "open", as soon as the corrected output signal $U_{Out,\,korr}(t)$ or a signal derived from this exceeds a predetermined threshold value $U_S$.

The signal $U_a(t)$ is formed from the control signal $U_{St}(t)$ for example in that the control signal $U_{St}(t)$ is scaled and offset in time:

$$U_a(t)=k*U_{St}(t-\Delta t_1)$$

The parameter $\Delta t_1$ designates a constant time duration and the parameter k a constant which is to be determined by means of a calibration.

The advantage of the second version exists in that, with this type of evaluation, the deflection of the clamping jaws 6 and 7 as a result of the acceleration of the clamping element 1 is not interpreted as a jamming of the substrate 8.

With both versions, the signal of the sensor $U_{Out}(t)$ or $U_{Out,\,korr}(t)$ can have signal peaks which are caused by electrical interference and are not due to catching or jamming of the substrate. Therefore, methods customary in signalling technique are preferably used in order to filter out signal peaks of this type and the signal U only formed from the filtered signal so that the signal U only changes from the value "close" to the value "open" when the transported substrate is really jammed.

Optionally, as in the example in FIG. 3, the clamping jaws 6 and 7 each have a rigid part 21 coming from the fixing plate 13 which has a surface 22 directed towards the bridge 15 and a surface 23 directed towards the bridge 16. (Only the part 21 secured to the fixing plate 13 of clamping jaw 6 is visible, the part 21 of clamping jaw 7 is not visible.) During operation, the part 21 serves to prevent excessive mechanical stretching of the bridges 15 and 16 of the clamping jaws 6 and 7. In the idle condition, the surface 22 and the bridge 15 are separated by an air gap, likewise the surface 23 and the bridge 16 are separated by an air gap. On acceleration and braking of the clamping element, the size of these air gaps changes as a result of the deflection of the bridges 15 and 16. The size of the air gaps in the idle condition is dimensioned so that either the bridge 15 comes to stop on the surface 22 or the bridge 16 comes to stop on the surface 23 before the bridge 15 or bridge 16 can be plastically deformed.

While embodiments and applications of this invention have been shown and described, it would be apparent to those skilled in the art having the benefit of this disclosure that many more modifications than mentioned above are possible without departing from the inventive concepts herein. The invention, therefore, is not to be restricted except in the spirit of the appended claims and their equivalents.

What is claimed is:

1. A clamping element comprising:
    a first and a second leg having a first and second clamping jaw, respectively, for clamping a substrate, each of the two clamping jaws comprising a clamping plate deflectable in a predefined direction relative to the corresponding leg, and
    a sensor for measuring a deflection of the first clamping plate relative to the first leg, an output signal of the sensor containing an information whether the two clamping jaws are to remain closed or are to be opened.

2. The clamping element according to claim 1, wherein the first clamping plate is connected via two bridges to a first fixing plate secured to the first leg and wherein the second clamping plate is connected via two further bridges to a second fixing plate secured to the second leg.

3. The clamping element according to claim 2, wherein the sensor consists of strain gauges which are secured to the two bridges which connect the first clamping plate and the first fixing plate.

4. The clamping element according to claim 3, further comprising a bolt, the bolt secured to one of the two legs and bearing on the other of the two legs.

5. The clamping element according to claim 4, further comprising a rigid part limiting the maximum possible deflection of the clamping plate.

6. The clamping element according to claim 3, further comprising a rigid part limiting the maximum possible deflection of the clamping plate.

7. The clamping element according to claim 2, further comprising a bolt, the bolt secured to one of the two legs and bearing on the other of the two legs.

8. The clamping element according to claim 7, further comprising a rigid part limiting the maximum possible deflection of the clamping plate.

9. The clamping element according to claim 2, further comprising a rigid part limiting the maximum possible deflection of the clamping plate.

10. The clamping element according to claim 1, further comprising a bolt, the bolt secured to one of the two legs and bearing on the other of the two legs.

11. The clamping element according to claim 10, further comprising a rigid part limiting the maximum possible deflection of the clamping plate.

12. The clamping element according to claim 1, further comprising a rigid part limiting the maximum possible deflection of the clamping plate.

* * * * *